United States Patent
Jeong et al.

(10) Patent No.: US 9,199,285 B2
(45) Date of Patent: Dec. 1, 2015

(54) SYSTEM AND METHOD FOR CLEANING SUBSTRATE

(75) Inventors: Beung-Hwa Jeong, Yongin (KR); Kwang-Nam Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 246 days.

(21) Appl. No.: 13/096,907

(22) Filed: Apr. 28, 2011

(65) Prior Publication Data

US 2012/0118331 A1 May 17, 2012

(30) Foreign Application Priority Data

Nov. 17, 2010 (KR) .................. 10-2010-0114531

(51) Int. Cl.
| | |
|---|---|
| *H01L 21/02* | (2006.01) |
| *B08B 3/02* | (2006.01) |
| *B08B 3/04* | (2006.01) |
| *H01L 21/67* | (2006.01) |
| *B08B 5/02* | (2006.01) |

(52) U.S. Cl.
CPC ............... *B08B 3/041* (2013.01); *B08B 3/022* (2013.01); *B08B 5/02* (2013.01); *H01L 21/67028* (2013.01); *H01L 21/67051* (2013.01)

(58) Field of Classification Search
CPC ........ B08B 3/022; B08B 3/041; B08B 3/123; H01L 21/67051; H01L 21/67028
USPC ............. 134/3, 15, 26, 28, 32, 41, 61, 115 R, 134/103.2, 95.3, 99.1, 133, 76
See application file for complete search history.

(56) References Cited

U.S. PATENT DOCUMENTS

| | | | | |
|---|---|---|---|---|
| 5,762,749 | A | * | 6/1998 | Suzuki et al. ............. 156/345.22 |
| 5,806,137 | A | * | 9/1998 | Ishi et al. .......................... 15/302 |
| 6,021,790 | A | * | 2/2000 | Yoshitani et al. ................ 134/62 |
| 6,230,722 | B1 | * | 5/2001 | Mitsumori et al. ........ 134/122 R |
| 6,261,377 | B1 | * | 7/2001 | Mertens et al. ..................... 134/6 |
| 6,497,240 | B1 | * | 12/2002 | Kobayashi et al. .......... 134/64 R |
| 2001/0006072 | A1 | * | 7/2001 | Kobayashi et al. .......... 134/64 R |
| 2002/0000019 | A1 | * | 1/2002 | Park et al. ........................ 15/302 |

(Continued)

FOREIGN PATENT DOCUMENTS

| | | |
|---|---|---|
| CN | 1574221 A | 2/2005 |
| CN | 1716023 A | 1/2006 |

(Continued)

OTHER PUBLICATIONS

SIPO Office action dated Jul. 1, 2015, with English translation, for corresponding Chinese Patent application 201110159759.0, (30 pages).

*Primary Examiner* — Michael Kornakov
*Assistant Examiner* — Katelyn Whatley
(74) *Attorney, Agent, or Firm* — Christie, Parker & Hale, LLP

(57) ABSTRACT

A substrate cleaning system including a carrying unit having a plurality of rollers for carrying a substrate, wherein each of the rollers includes a roller shaft and a plurality of division rollers coupled to the roller shaft, and wherein a gap between adjacent ones of the roller shafts is larger than a radius of each of the division rollers; a first rinse unit located along the carrying unit and configured to apply a first cleaning liquid onto the substrate; and a cleaning unit comprising a slit nozzle and configured to apply a second cleaning liquid to the substrate after it encounters the first rinse unit.

8 Claims, 7 Drawing Sheets

(56) References Cited

U.S. PATENT DOCUMENTS

| | | | |
|---|---|---|---|
| 2004/0187896 A1* | 9/2004 | Konishi et al. | 134/33 |
| 2005/0148197 A1* | 7/2005 | Woods et al. | 438/745 |
| 2009/0308413 A1* | 12/2009 | Freer et al. | 134/21 |

FOREIGN PATENT DOCUMENTS

| | | | |
|---|---|---|---|
| CN | 1725074 A | | 1/2006 |
| CN | 1931446 A | | 3/2007 |
| CN | 101192008 A | | 6/2008 |
| CN | 101758036 A | | 6/2010 |
| JP | 07-006991 | | 1/1995 |
| KR | 10-2007-0037878 A | | 4/2007 |
| KR | 1020070037878 | * | 4/2007 |
| KR | 10-2007-0054944 | | 5/2007 |
| KR | 10-0761977 B1 | | 9/2007 |
| KR | 10-2008-0051551 A | | 6/2008 |
| KR | 1020080051551 | * | 6/2008 |
| KR | 10-2008-0062920 A | | 7/2008 |
| KR | 1020080062920 | * | 7/2008 |
| KR | 10-2009-0055993 A | | 6/2009 |
| KR | 10-2009-0059692 | | 6/2009 |
| KR | 1020090055993 | * | 6/2009 |
| KR | 10-2009-0069380 A | | 7/2009 |

\* cited by examiner

SYSTEM AND METHOD FOR CLEANING SUBSTRATE

CROSS-REFERENCE TO RELATED APPLICATION

This application claims priority to and the benefit of Korean Patent Application No. 10-2010-0114531 filed in the Korean Intellectual Property Office on Nov. 17, 2010, the entire contents of which are incorporated herein by reference.

BACKGROUND

1. Field

The described technology relates generally to a system and method for cleaning a substrate.

2. Description of Related Art

A flat panel display is a thin display device having a flat panel and being relatively thin with respect to other display devices. Typical examples of a flat panel display include a liquid crystal display (LCD), a plasma display device, an organic light emitting diode (OLED) display, etc.

A flat panel display includes a display panel for displaying an image, and in order to manufacture such a display panel, various processes, for example, an etching process and a cleaning process are performed.

Particularly, when cleaning a silicon oxide film on an amorphous silicon layer that is formed in the OLED display or a silicon oxide film on a polysilicon layer, a spin cleaning method, or a track cleaning method of spraying a hydrofluoric acid (HF) cleaning liquid to a substrate on an in-line with a spray method or of flowing a hydrofluoric acid cleaning liquid with a flow method is used.

However, as the OLED display is formed in relatively larger sizes, in a spin cleaning method, it is difficult to rotate a substrate in a high speed, and in a track cleaning method, etching uniformity is difficult due to an etching difference between an intermediate portion and an edge portion of a substrate, and thus a crystallization process of an amorphous silicon layer, which follows the etching and an interface between a polysilicon layer and a gate insulating layer are affected, whereby a problem such as a crystallization stain and an element failure occurs.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a system and method for cleaning a substrate having the characteristics of improving etching uniformity and remarkably reducing a use amount of a cleaning liquid.

An exemplary embodiment includes a substrate cleaning system including a carrying unit having a plurality of rollers for carrying a substrate, wherein each of the rollers includes a roller shaft and a plurality of division rollers coupled to the roller shaft, and wherein a gap between adjacent ones of the roller shafts is larger than a radius of each of the division rollers; a first rinse unit located along the carrying unit and configured to apply a first cleaning liquid onto the substrate; and a cleaning unit comprising a slit nozzle and configured to apply a second cleaning liquid to the substrate after it encounters the first rinse unit.

Division rollers of the adjacent rollers may be alternately arranged.

A silicon layer and a silicon oxide film may be sequentially formed on the substrate.

The first cleaning liquid may be ultrapure water or deionized water, and the second cleaning liquid may be an aqueous solution including ammonium fluoride or hydrofluoric acid.

A concentration of hydrofluoric acid of the second cleaning liquid may be 0.2% to 2.0%.

A width of an ejection opening of the slit nozzle may be 0.1 mm to 2 mm.

The slit nozzle may include a hydrofluoric acid resistant material.

A second gap between the slit nozzle and an upper surface of the substrate may be 1.5 mm to 5 mm.

The cleaning unit may further include an air knife that removes the first cleaning liquid on the substrate; and an aqua knife that removes the second cleaning liquid on the substrate.

The substrate cleaning system may further include a second rinse unit that ejects a third cleaning liquid to the substrate that passes through the cleaning unit.

The third cleaning liquid may be ultrapure water or deionized water.

In another embodiment, a method of cleaning a substrate is provided, the method including loading the substrate onto a carrying unit; moving the substrate under a first rinse unit with the carrying unit and applying a first cleaning liquid to the substrate using the first rinse unit; moving the substrate under a cleaning unit with the carrying unit and applying a second cleaning liquid to the substrate using a slit nozzle of the cleaning unit; and performing a reaction process of the second cleaning liquid while sustaining the substrate to which the second cleaning liquid is applied in a horizontal state.

A reaction time period that performs the reaction process may be 5 seconds to 100 seconds.

A silicon layer and a silicon oxide film may be sequentially formed on the substrate, and the silicon oxide film may be etched using the second cleaning liquid in the reaction process.

The applying of a second cleaning liquid to the substrate may include forming the second cleaning liquid in a predetermined thickness on the substrate.

The applying of a second cleaning liquid to the substrate may be performed while sustaining the substrate in a horizontal state.

At the applying of a second cleaning liquid to the substrate, a gap between the slit nozzle and an upper surface of the substrate may be 1.5 mm to 5 mm.

The method may further includes, after the ejecting of a first cleaning liquid on the substrate, removing the first cleaning liquid from the substrate in which the first cleaning liquid remains using an air knife.

The method may further include, after the performing of a reaction process of the second cleaning liquid, removing a reaction material of the second cleaning liquid in which the reaction process is performed using an aqua knife from the substrate.

The first cleaning liquid may be ultrapure water or deionized water, and the second cleaning liquid may be an aqueous solution including ammonium fluoride or hydrofluoric acid.

A concentration of hydrofluoric acid of the second cleaning liquid may be 0.2% to 2.0%.

The method may further include ejecting the third cleaning liquid onto the substrate in which a reaction material of the second cleaning liquid is removed using the second rinse unit.

According to an exemplary embodiment, by applying a second cleaning liquid in a uniform thickness only onto a silicon oxide film using a slit nozzle, a use amount of the second cleaning liquid can be remarkably reduced, compared with a conventional spin cleaning method, spray method, or flow method.

Further, by minimizing a width of an ejection opening of a slit nozzle and a gap between a slit nozzle and a substrate, a second cleaning liquid of a uniform thickness is applied onto a silicon oxide film and a division roller of one roller of adjacent rollers of a carrying unit is alternately arranged with the other one division roller, a first gap between adjacent roller shafts is larger than a size of a radius of a division roller and is 20 mm or less and thus by reducing an area of a portion in which the division roller and the substrate doe not contact, flatness of the substrate is improved and thus etching uniformity of the silicon oxide film can be improved.

Further, while etching uniformity of the silicon oxide film is improved, a method of cleaning a substrate can be applied to a large sized-substrate.

Further, because etching uniformity is improved, a crystallization stain and an element failure are prevented from occurring.

Further, because the second cleaning liquid is applied only onto a silicon oxide film in a uniform thickness using a slit nozzle and a substrate is stopped under a cleaning unit during a reaction time period, a manufacturing space can be reduced, compared with a conventional spray method, and because a separate slope time period is unnecessary, compared with a conventional flow method, a tact time can be reduced.

DETAILED DESCRIPTION OF THE EMBODIMENTS

Figure 1:
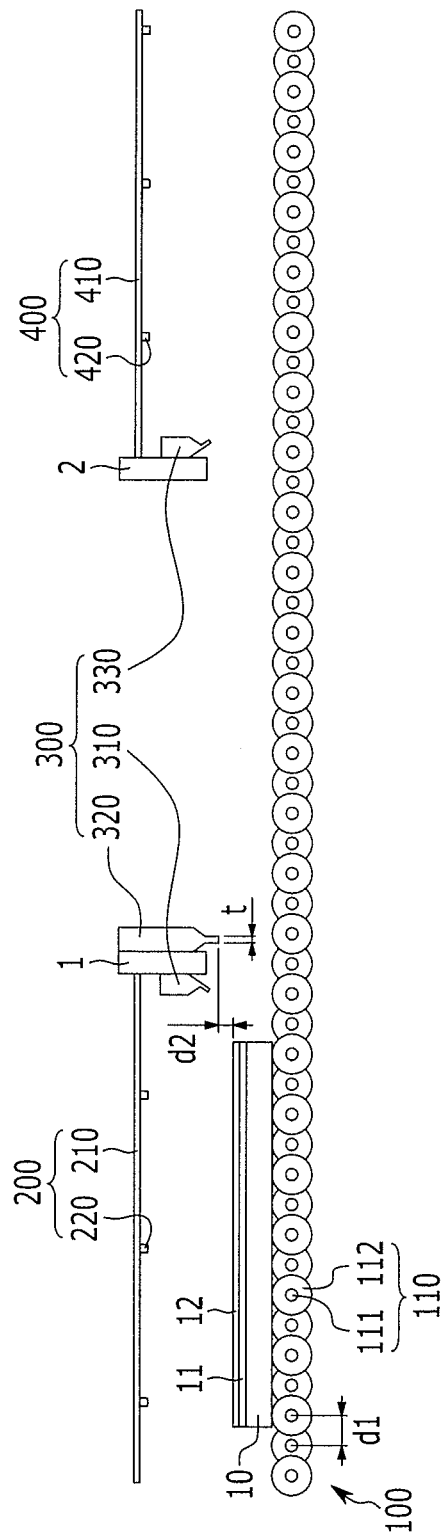
FIG. 1 is a schematic diagram of a substrate cleaning system according to an exemplary embodiment.

The present invention will be described more fully hereinafter with reference to the accompanying drawings, in which exemplary embodiments of the invention are shown.

The drawings and description are to be regarded as illustrative in nature and not restrictive. Like reference numerals designate like elements throughout the specification.

Figure 2:
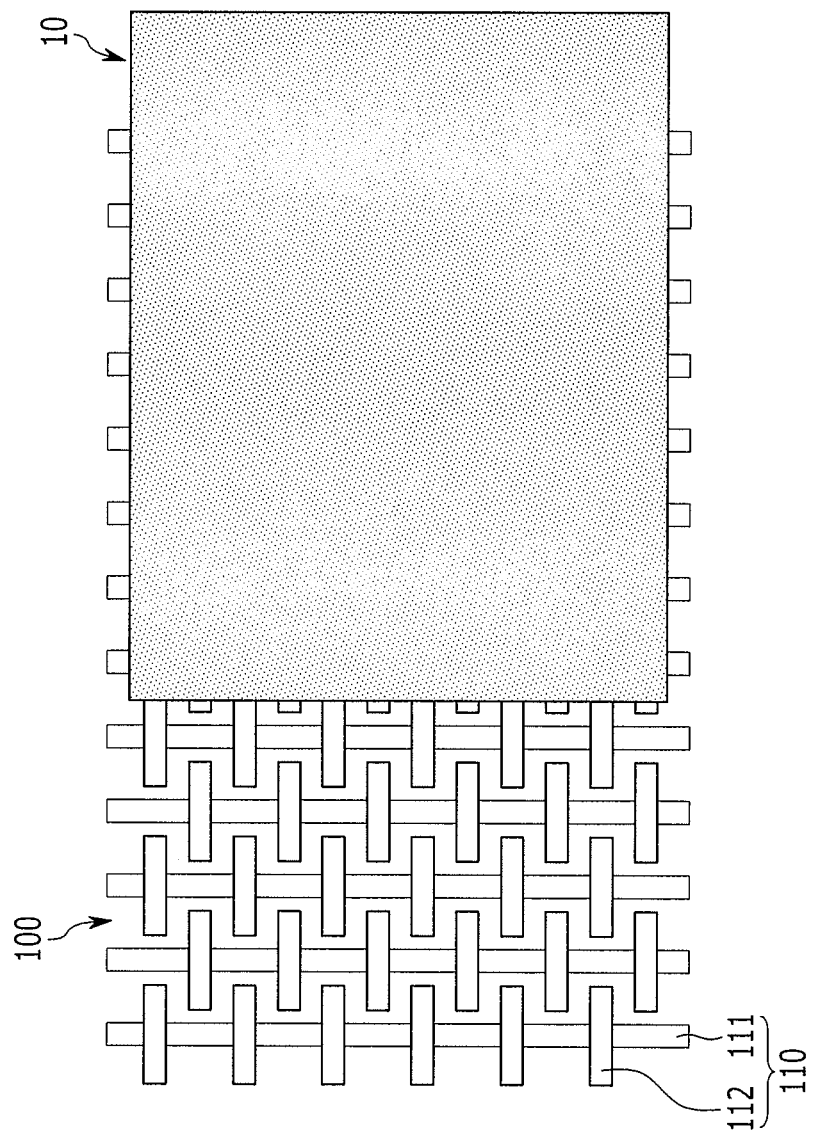
FIG. 2 is a top plan view illustrating a carrying unit of the substrate cleaning system of FIG. 1.

FIG. 1 is a schematic diagram of a substrate cleaning system according to an exemplary embodiment, and FIG. 2 is a top plan view illustrating a carrying unit of the substrate cleaning system of FIG. 1.

As shown in FIG. 1, a substrate cleaning system according to an exemplary embodiment includes a carrying unit 100 that carries a substrate 10, a first rinse unit 200 that positions on the carrying unit 100 and that ejects a first cleaning liquid 20 (see FIG. 3) on the substrate 10, and a cleaning unit 300 that applies a second cleaning liquid 30 (see FIG. 4) to the substrate 10 that passes through the first rinse unit 200.

A silicon layer 11 of an amorphous silicon layer or a polysilicon layer is formed on the substrate 10, and a silicon oxide film 12 is formed on the silicon layer 11. The silicon oxide film 12 is an oxide film that is formed on the silicon layer 11 in a manufacturing process and can be removed using a substrate cleaning system according to an exemplary embodiment.

The carrying unit 100 includes a plurality of rollers 110 that are disposed at a predetermined gap, and the roller 110 includes a roller shaft 111 and a plurality of division rollers 112 that are coupled to the roller shaft 111.

As shown in FIG. 2, a plurality of roller shafts 111 are oriented parallel to each other, and a plurality of division rollers 112 rotate with a rotation of the roller shaft 111 and rotate the substrate 10 contacting the division roller 112. The division roller 112 may be made of a material such as rubber having a large friction force or coefficient.

The division roller 112 of one roller 110 of adjacent rollers 110 is alternately arranged with another division roller 112. Therefore, because an area of a portion in which the division roller 112 and the substrate 10 do not contact can be reduced, flatness of the substrate 10 can be improved.

Further, a first gap d1 between adjacent roller shafts 111 is larger than a size of a radius of the division roller 112 and, for example, may be about 20 mm or less. If the first gap d1 is smaller than a size of a radius of the division roller 112, the division roller 112 of a first roller 110 of the adjacent rollers 110 contacts a roller shaft 111 of a second roller 110 and thus a friction force occurs. If the first gap d1 is larger than 20 mm, it is difficult for the roller shaft 111 to appropriately rotate and an area which the division roller 112 does not support the substrate 10 increases, which may cause a cleaning liquid to pool in the area and thus the substrate 10 may be bent due to a weight of the cleaning liquid, whereby flatness of the substrate 10 may be affected.

The first rinse unit 200 is separated from the carrying unit 100 to be positioned at an upper part thereof. The first rinse unit 200 includes a first support 210 that is attached to a first fixing frame 1 and a plurality of first ejection portions 220 that are connected to the first support 210 and that eject a first cleaning liquid 20 onto the substrate 10. The first cleaning liquid 20 may use ultrapure water or deionized water (DI water). The first cleaning liquid 20 that is ejected from the first rinse unit 200 removes a contamination material on a silicon oxide film 12.

The cleaning unit 300 includes an air knife 310 that is attached to the first fixing frame 1, a slit nozzle 320 that is attached to the first fixing frame 1 and that is located behind the air knife 310 in a traveling direction of the substrate 10, and an aqua knife 330 that is attached to a second fixing frame 2 that is separated by a gap from the first fixing frame 1.

The air knife 310 removes a residue of the first cleaning liquid 20 on the substrate 10 that is carried under the cleaning unit 300 using a high air pressure.

Because a width t of an ejection opening 321 of the slit nozzle 320 is a small width of about 0.1 mm to 2 mm, the second cleaning liquid 30 is ejected onto the substrate 10 in a substantially uniform thickness. Further, because a second gap d2 between the ejection opening 321 of the slit nozzle 320 and an upper surface of the substrate 10, i.e., the silicon oxide film 12 is a small size of 1.5 mm to 5 mm, the second cleaning liquid 30 that is ejected from the slit nozzle 320 is applied in a substantially uniform thickness onto the silicon oxide film 12. The second cleaning liquid 30 is an aqueous solution including ammonium fluoride ($NH_4F$) or hydrofluoric acid (HF), and a concentration of hydrofluoric acid of the aqueous solution may be 0.2% to 2.0%. Because the second cleaning liquid 30 is an aqueous solution including ammonium fluoride ($NH_4F$) or hydrofluoric acid (HF), the slit nozzle 320 is made of a hydrofluoric acid resistant material. The second cleaning liquid 30 that is applied in a substantially uniform thickness is deformed into a reaction material 31 that is separated from the silicon layer 11 by reacting with the silicon oxide film 12 under the second cleaning liquid 30.

The aqua knife 330 removes the reaction material 31 of the second cleaning liquid 30 on the substrate 10 using DI water of a high water pressure.

A second rinse unit 400 is disposed at the rear side of the cleaning unit 300 in a travel direction of the substrate 10. The second rinse unit 400 is separated from the carrying unit 100 to be positioned at an upper part thereof and includes a second support 410 that is attached to the second fixing frame 2 and a plurality of second ejection portions 420 that are connected to the second support 410 and that eject a third cleaning liquid 40 onto the substrate 10. The third cleaning liquid 40 can use ultrapure water or DI water.

The third cleaning liquid 40 that is ejected from the second rinse unit 400 removes a contamination material or a residue of the reaction material 31 on the silicon layer 11.

In this way, because a substrate cleaning system according to an exemplary embodiment applies the second cleaning liquid 30 in a substantially uniform thickness only onto the silicon oxide film 12 using the slit nozzle 320, an amount of the second cleaning liquid 30 used can be remarkably reduced, compared with a conventional spin cleaning method, spray method, or flow method.

Further, by minimizing a width t of the ejection opening 321 of the slit nozzle 320 and the second gap d2 between the slit nozzle 320 and the substrate 10, the second cleaning liquid 30 of a substantially uniform thickness is applied onto the silicon oxide film 12, and the division roller 112 of one roller 110 of the adjacent rollers 110 of the carrying unit 100 is alternately arranged with the other one division roller 112, and because the first gap d1 between the adjacent roller shafts 111 is larger than a size of a radius of the division roller 112 and is 20 mm or less, an area of a portion in which the division roller 112 and the substrate 10 do not contact is minimized, and thus flatness of the substrate 10 is maximized, whereby etching uniformity of the silicon oxide film 12 can be improved.

Hereinafter, a method of cleaning a substrate using a substrate cleaning system according to an exemplary embodiment will be described in detail with reference to FIGS. 3 to 7.

FIGS. 3 to 7 are diagrams sequentially illustrating a method of cleaning a substrate using a substrate cleaning system according to an exemplary embodiment.

Figure 3:
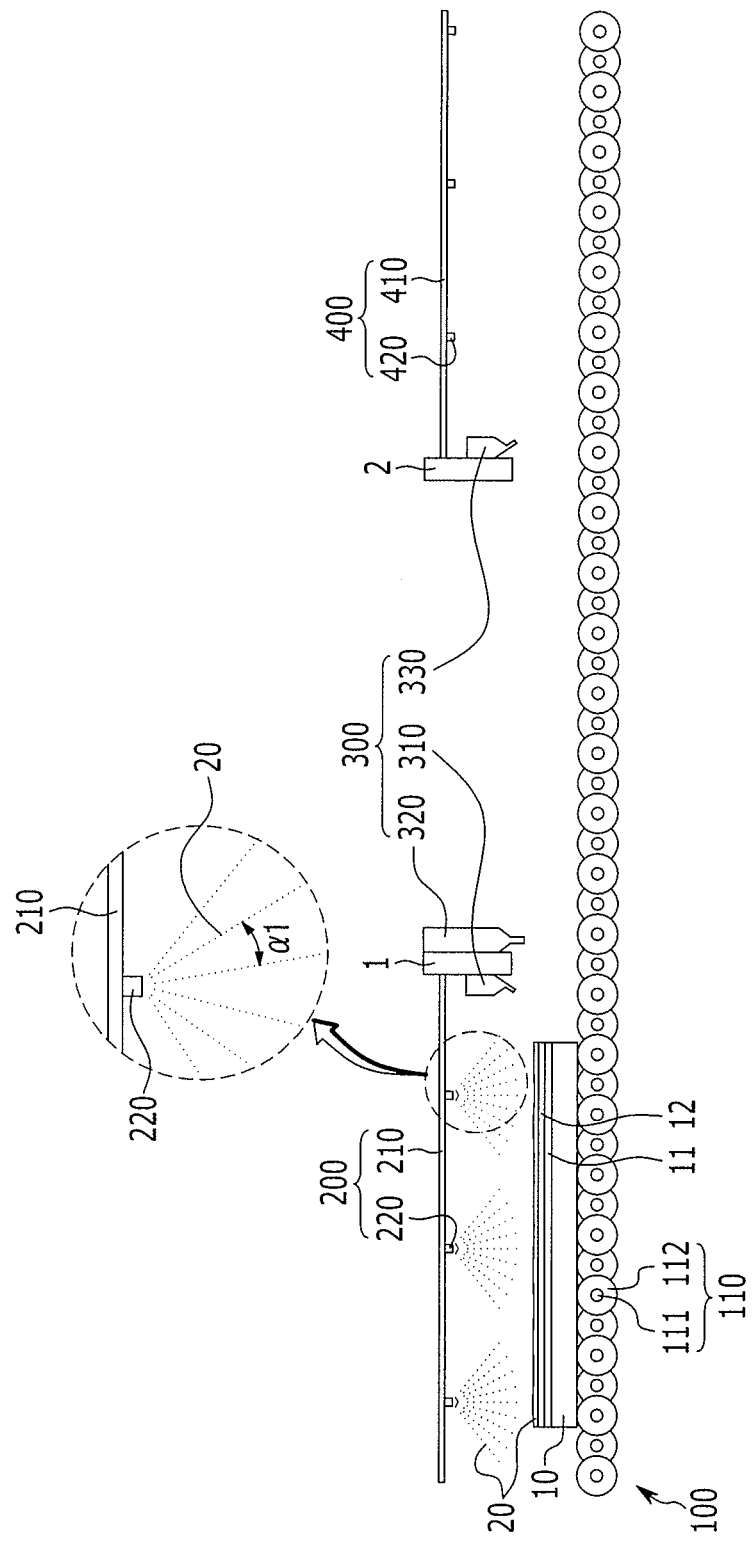
FIGS. 3 to 7 are diagrams sequentially illustrating a method of cleaning a substrate using a substrate cleaning system according to an exemplary embodiment.

First, as shown in FIG. 3, in a method of cleaning a substrate according to an exemplary embodiment, the first cleaning liquid 20 is ejected onto the substrate 10 that is loaded on the carrying unit 100 using the first rinse unit 200. The first cleaning liquid 20 that is ejected from the first rinse unit 200 removes a contamination material on the silicon oxide film 12 that is formed on the substrate 10. In this case, when an ejection angle of the first ejection portion 210 of the first rinse unit 200 is excessively small or excessively large, the first cleaning liquid 20 is intensively ejected in a narrow range or is widely ejected in a wide range and thus uniform cleaning may not be performed and therefore, in one embodiment, an ejection angle a1 of the first ejection portion 210 is set within a range of about 30° to about 75° from a direction perpendicular to a traveling direction of the substrate 10.

Figure 4:
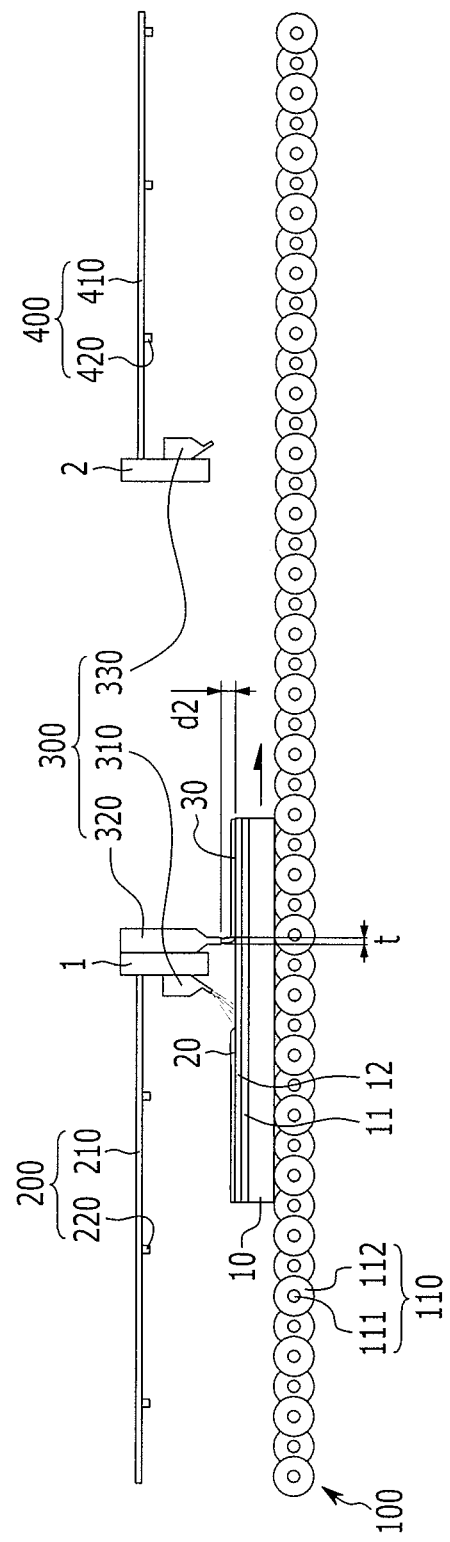

Next, as shown in FIG. 4, by rotating the roller shaft 111, the carrying unit 100 moves the substrate 10 on the carrying unit 100 under the cleaning unit 300. In this case, because the air knife 310 is located at a front of the cleaning unit 300 (i.e., it is encountered first by an object on the carrying unit 100), a residue of the first cleaning liquid 20 on the substrate 10 is removed using a high air pressure.

At the same time, the second cleaning liquid 30 is applied onto the silicon oxide film 12 of the substrate 10 using the slit nozzle 320 of the cleaning unit 300. In this case, because a width t of the ejection opening 321 of the slit nozzle 320 is small (for example, about 0.1 mm to 2 mm), the second cleaning liquid 30 is ejected onto the substrate 10 in a uniform thickness. Because the second gap d2 between the ejection opening 321 of the slit nozzle 320 and the silicon oxide film 12 of the substrate 10 is a small size of 1.5 mm to 5 mm, the second cleaning liquid 30 that is ejected from the slit nozzle 320 is applied in a substantially uniform thickness onto the silicon oxide film 12. By constantly being applied to the moving substrate 10, the second cleaning liquid 30 is applied in a substantially uniform thickness onto the silicon oxide film 12.

Figure 5:
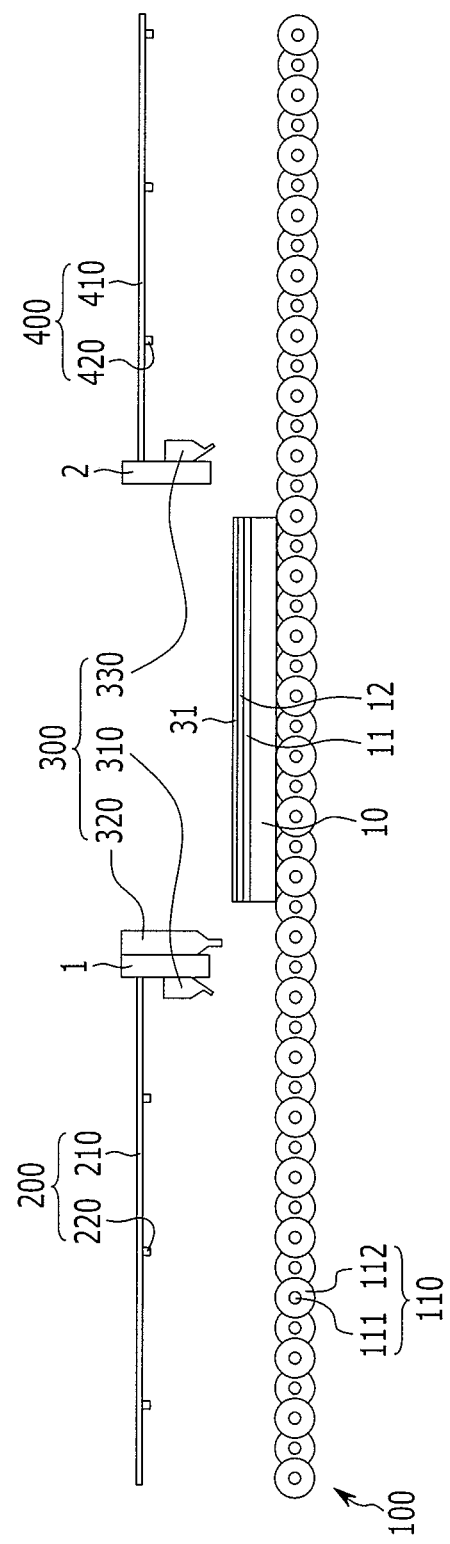

Next, as shown in FIG. 5, the substrate 10 to which the second cleaning liquid 30 is applied is sustained in a horizontal state and a reaction process of the second cleaning liquid 30 is performed. The second cleaning liquid 30 that is applied in a substantially uniform thickness is deformed into the reaction material 31 that is separated from the silicon layer 11 by reacting with the silicon oxide film 12 under the second cleaning liquid 30. In this case, a reaction time period in which a reaction process is performed may be about 5 seconds to 100 seconds. If a reaction time period is smaller than about 5 seconds, a time period in which the second cleaning liquid 30 reacts with the silicon oxide film 12 may be too short and thus it is difficult to completely remove the silicon oxide film 12, and if a reaction time period is longer than about 100 seconds, a time to complete the entire process may be too long.

Further, the division roller 112 of a first roller 110 of the adjacent rollers 110 of the carrying unit 100 is alternately arranged with a second division roller 112, and by adjusting the first gap d1 between the adjacent roller shafts 111, an area of a portion in which the division roller 112 and the substrate 10 do not contact is reduced and thus flatness of the substrate 10 is maximized, whereby etching uniformity of the silicon oxide film 12 can be improved.

Further, the rollers 110 are classified into a contact roller that contacts with the substrate 10 and a non-contact roller that does not contact with the substrate 10, and a gap between the non-contact roller and the substrate 10 may be about 5 mm or less, and a gap between the non-contact roller and the contact roller may be between about 30 mm and about 100 mm.

Figure 6:
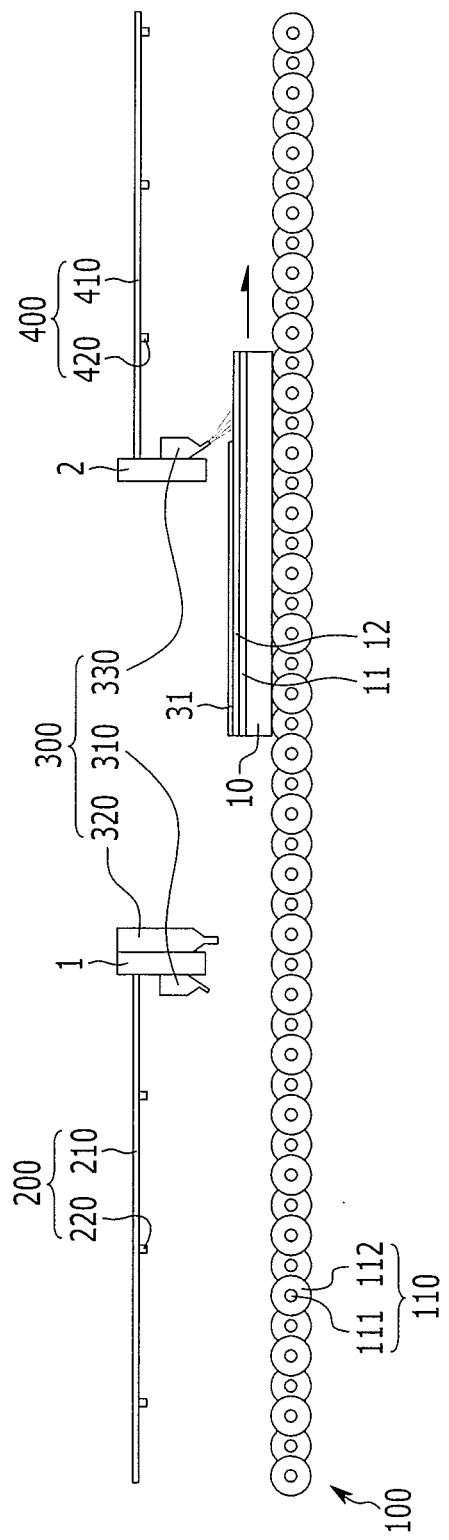

Next, as shown in FIG. 6, a reaction material 31 of the second cleaning liquid 30 is removed from the substrate 10 with DI water of a high water pressure using the aqua knife 330.

Figure 7:
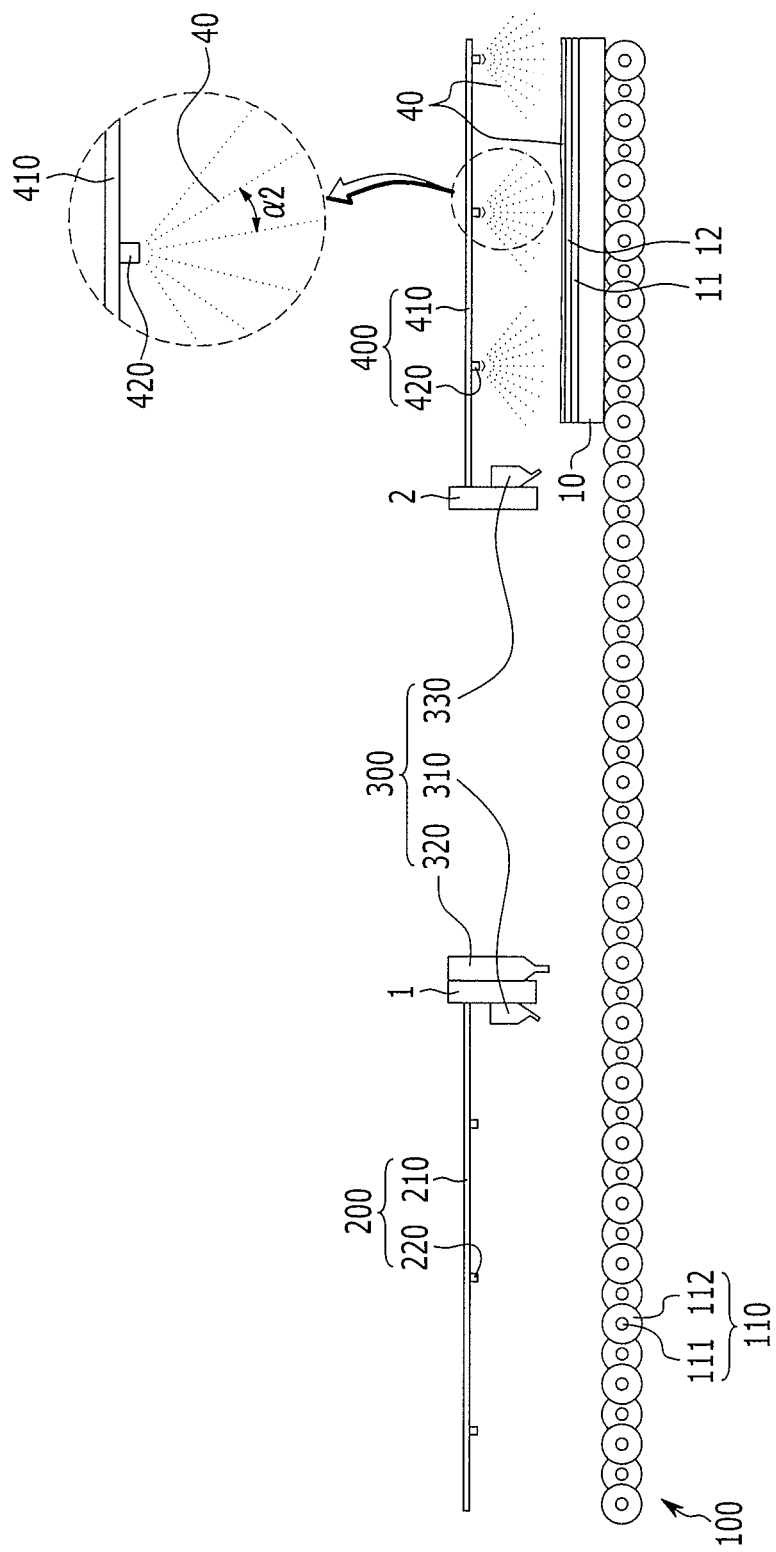

Next, as shown in FIG. 7, the third cleaning liquid 40 is ejected onto the substrate 10 in which the reaction material 31 of the second cleaning liquid 30 is removed using the second rinse unit 400. The third cleaning liquid 40 can use ultrapure water or DI water, and the third cleaning liquid 40 that is ejected from the second rinse unit 400 removes a contamination material or a residue of the reaction material 31 on the silicon layer 11.

In this case, in order for the third cleaning liquid 40 that is ejected from the second rinse unit 400 not to be injected into the cleaning unit 300, an ejection angle a2 of the second ejection portion 420 may be set at up to about 30° from a direction perpendicular to a traveling direction of the substrate 10.

Accordingly, in a method of cleaning a substrate according to an exemplary embodiment, because the second cleaning liquid 30 is applied in a substantially uniform thickness only onto the silicon oxide film 12 using the slit nozzle 320, a use amount of the second cleaning liquid 30 can be remarkably reduced to about 1/10 compared with a conventional spin cleaning method, spray method, or flow method. Further, while improving etching uniformity of the silicon oxide film 12, the method can be applied to a large sized-substrate 10. Further, because etching uniformity is improved, a crystallization stain and an element failure are prevented from occurring.

In a conventional spray method, because the substrate 10 is continuously carried, a length of the cleaning unit 300 is extended and thus much manufacturing space may be occupied, and in a conventional flow method, because a slope time period of the substrate 10 for flowing the second cleaning liquid 30 is necessary, a process time is relatively long. However, in a system and method for cleaning a substrate according to an exemplary embodiment, because the second cleaning liquid 30 is applied in a substantially uniform thickness only onto the silicon oxide film 12 using the slit nozzle 320 and the substrate 10 is stopped under the cleaning unit 300 during a reaction time period, a manufacturing space can be minimized compared with a conventional spray method, and a separate slope time period is unnecessary, compared with a conventional flow method and thus a process time can be minimized.

A system and method for cleaning a substrate according to an exemplary embodiment are applied to the substrate 10 of a flat panel display, as described above, and can be applied to the substrate 10 to be used to a liquid crystal display (LCD) and an organic light emitting diode (OLED) display.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| 10: substrate | 20: first cleaning liquid |
|---|---|
| 30: second cleaning liquid | 40: third cleaning liquid |
| 100: carrying unit | 200: first rinse unit |
| 300: cleaning unit | 400: second rinse unit |

What is claimed is:

1. A method of cleaning a substrate, the method comprising:
   loading the substrate onto a carrying unit;
   forming a silicon layer and a silicon oxide film on the substrate;
   moving the substrate under a first rinse unit with the carrying unit and applying a first cleaning liquid to the substrate using the first rinse unit;
   moving the substrate under a cleaning unit with the carrying unit, the cleaning unit comprising an air knife and a slit nozzle attached to a fixing frame, wherein the cleaning unit simultaneously removes the first cleaning liquid using the air knife and simultaneously applies a second cleaning liquid to the substrate to etch the silicon oxide film using the slit nozzle, wherein during the applying of the second cleaning liquid to the substrate, a gap between the slit nozzle and an upper surface of the substrate is between 1.5 mm and 5 mm, such that the second cleaning liquid on the substrate has a uniform thickness, and wherein the substrate is stopped under the cleaning unit during a reaction time period; and
   performing a reaction process of the second cleaning liquid while sustaining the substrate to which the second cleaning liquid is applied in a horizontal state.

2. The method of claim 1, wherein a reaction time period of the reaction process is between 5 seconds and 100 seconds.

3. The method of claim 1, wherein the applying of a second cleaning liquid to the substrate comprises forming the second cleaning liquid to a threshold thickness on the substrate.

4. The method of claim 1, wherein the applying of a second cleaning liquid to the substrate is performed while sustaining the substrate in a horizontal state.

5. The method of claim 1, further comprising:
   after the performing of the reaction process of the second cleaning liquid, removing a reaction material of the second cleaning liquid from the substrate using an aqua knife.

6. The method of claim 1, wherein the first cleaning liquid is ultrapure water or deionized water, and the second cleaning liquid is an aqueous solution comprising ammonium fluoride or hydrofluoric acid.

7. The method of claim 6, wherein a concentration of hydrofluoric acid of the second cleaning liquid is between about 0.2% and about 2.0%.

8. The method of claim 1, further comprising using a second rinse unit to apply a third cleaning liquid on the substrate so that a reaction material of the second cleaning liquid is removed.

* * * * *